United States Patent
Grau et al.

(10) Patent No.: US 11,740,722 B2
(45) Date of Patent: Aug. 29, 2023

(54) METHOD AND APPARATUS FOR AUTOMOTIVE VARIABLE IMPEDANCE TOUCH SENSOR ARRAY

(71) Applicant: Sensel, Inc., Sunnyvale, CA (US)

(72) Inventors: Alexander Meagher Grau, Durham, NC (US); Bethany Noel Haniger, Los Gatos, CA (US); Mark Joshua Rosenberg, Sunnyvale, CA (US); Reuben Eric Martinez, Gilroy, CA (US); Scott Gregory Isaacson, Mountain View, CA (US); Stephanie Jeanne Oberg, Sunnyvale, CA (US); Timothy James Miller, Half Moon Bay, CA (US); Tomer Moscovich, San Francisco, CA (US)

(73) Assignee: Sensel, Inc., Sunnyvale, CA (US)

( * ) Notice: Subject to any disclaimer, the term of this patent is extended or adjusted under 35 U.S.C. 154(b) by 0 days.

(21) Appl. No.: 17/750,971

(22) Filed: May 23, 2022

(65) Prior Publication Data
US 2022/0283663 A1    Sep. 8, 2022

Related U.S. Application Data

(63) Continuation of application No. 17/226,522, filed on Apr. 9, 2021, now Pat. No. 11,353,979, which is a
(Continued)

(51) Int. Cl.
*G06F 3/041* (2006.01)
*B62D 1/04* (2006.01)
(Continued)

(52) U.S. Cl.
CPC ............. *G06F 3/0414* (2013.01); *B60Q 9/00* (2013.01); *B62D 1/04* (2013.01); *G06F 3/0416* (2013.01); *H03M 1/22* (2013.01)

(58) Field of Classification Search
CPC ....... G06F 3/0414; G06F 3/0416; B60Q 9/00; B62D 1/04; H03M 1/22
See application file for complete search history.

(56) References Cited

U.S. PATENT DOCUMENTS 9,248,839 B1 *  2/2016  Tan ........................ B60K 37/06
9,459,746 B2   10/2016  Rosenberg et al.
(Continued)

OTHER PUBLICATIONS

Final Office Action received for U.S. Appl. No. 17/237,224 dated Jul. 12, 2022, 23 pages.
(Continued)

*Primary Examiner* — Kenneth B Lee, Jr.
(74) *Attorney, Agent, or Firm* — Amin, Turocy & Watson, LLP

(57) ABSTRACT

The present invention relates to automotive interface systems and methods. In one embodiment, an automotive interface system includes a steering wheel and an integrated interpolated variable impedance array that comprises a grid of sensing elements. The sensing elements are configured to power on simultaneously and to simultaneously generate multiple currents along multiple current paths in response to sensing a touch wherein the amount of current generated by a sensing element of the grid is directly proportional to the force applied by the touch. The automotive interface system also includes an analog-to-digital converter (ADC) and a processor communicatively coupled to the interpolated variable impedance array that are configured to receive the multiple currents along multiple current paths and determine a location, a duration, an area, and a force of the touch from the multiple currents along multiple current paths.

20 Claims, 12 Drawing Sheets

Related U.S. Application Data continuation of application No. 16/414,419, filed on May 16, 2019, now Pat. No. 11,003,274.

(60) Provisional application No. 62/730,757, filed on Sep. 13, 2018.

(51) Int. Cl.
  B60Q 9/00 (2006.01)
  H03M 1/22 (2006.01)

(56) References Cited

U.S. PATENT DOCUMENTS

| | | |
|---|---|---|
| 9,465,477 B2 | 10/2016 | Rosenberg et al. |
| 9,746,964 B2 | 8/2017 | Rosenberg et al. |
| 9,864,460 B2 | 1/2018 | Rosenberg et al. |
| 9,864,461 B2 | 1/2018 | Rosenberg et al. |
| 10,073,565 B2 | 9/2018 | Rosenberg et al. |
| 10,088,947 B2 | 10/2018 | Rosenberg et al. |
| 10,254,943 B2 | 4/2019 | Jubner et al. |
| 10,891,050 B2 | 1/2021 | Zarraga et al. |
| 10,990,223 B2 | 4/2021 | Zarraga et al. |
| 11,194,415 B2 | 12/2021 | Zarraga et al. |
| 2007/0018970 A1 | 1/2007 | Tabasso et al. |
| 2008/0246726 A1 | 10/2008 | Gettemy |
| 2009/0109191 A1 | 4/2009 | Felder et al. |
| 2009/0167722 A1 | 7/2009 | Villain |
| 2009/0256817 A1 | 10/2009 | Perlin et al. |
| 2011/0284304 A1 | 11/2011 | Van Schoiack |
| 2012/0001861 A1 | 1/2012 | Townsend et al. |
| 2012/0056837 A1 | 3/2012 | Park et al. |
| 2013/0120302 A1 | 5/2013 | Kang et al. |
| 2013/0307799 A1 | 11/2013 | Hauf |
| 2014/0071077 A1 | 3/2014 | Kang |
| 2014/0218309 A1 | 8/2014 | Park |
| 2014/0253440 A1 | 9/2014 | Karakotsios et al. |
| 2014/0267100 A1 | 9/2014 | Sohn et al. |
| 2014/0313163 A1 | 10/2014 | Coni et al. |
| 2014/0317722 A1 | 10/2014 | Tartz et al. |
| 2015/0077364 A1 | 3/2015 | Parthasarathy et al. |
| 2015/0091858 A1 | 4/2015 | Rosenberg et al. |
| 2015/0091859 A1 | 4/2015 | Rosenberg et al. |
| 2015/0339001 A1 | 11/2015 | Zirkl et al. |
| 2016/0313801 A1 | 10/2016 | Wagner et al. |
| 2017/0035329 A1 | 2/2017 | Gavish |
| 2017/0038910 A1 | 2/2017 | Lee |
| 2017/0285848 A1 | 5/2017 | Rosenberg et al. |
| 2017/0185289 A1 | 6/2017 | Kim et al. |
| 2017/0336891 A1 | 11/2017 | Rosenberg et al. |
| 2018/0113512 A1 | 4/2018 | Kang et al. |
| 2018/0224955 A1 | 8/2018 | Chen et al. |
| 2019/0079655 A1 | 3/2019 | Park |
| 2020/0073507 A1 | 3/2020 | Hung et al. |
| 2020/0218418 A1 | 7/2020 | Zarraga et al. |

OTHER PUBLICATIONS

Final Office Action received for U.S. Appl. No. 16/724,548 dated May 25, 2022, 27 pages.
Non-Final Office Action received for U.S. Appl. No. 16/384,331 dated Apr. 16, 2020, 30 pages.
Non-Final Office Action received for U.S. Appl. No. 16/519,319 dated May 18, 2020, 31 pages.
Non-Final Office Action received for U.S. Appl. No. 16/568,691 dated May 5, 2020, 39 pages.
International Search Report and Written Opinion received for PCT Application Serial No. PCT/US2019/068287 dated Apr. 24, 2020, 13 pages.
International Search Report and Written Opinion received for PCT Application Serial No. PCT/US2019/068284 dated Mar. 13, 2020, 08 pages.
Lo et al.,"Bendy: an Exploration into Gaming with Mobile Flexible Devices", in: Carleton University, Feb. 20, 2020, 20 pages.
Non-Final Office Action received for U.S. Appl. No. 16/414,419 dated Jun. 11, 2020, 22 pages.
Final Office Action received for U.S. Appl. No. 16/519,319 dated Sep. 16, 2020, 17 pages.
Non-Final Office Action received for U.S. Appl. No. 16/724,548 dated Mar. 3, 2021, 46 pages.
Non-Final Office Action received for U.S. Appl. No. 16/724,541 dated Apr. 21, 2021, 34 pages.
Non Final Office Action received for U.S. Appl. No. 17/113,818 dated Aug. 17, 2021, 32 pages.
Non Final Office Action received for U.S. Appl. No. 17/226,522 dated Aug. 27, 2021, 30 pages.
Final Office Action received for U.S. Appl. No. 16/724,548 dated Aug. 11, 2021, 32 pages.
International Preliminary Report on Patentability received for PCT Application Serial No. PCT/US2019/068284 dated Jul. 8, 2021, 07 pages.
International Preliminary Report on Patentability received for PCT Application Serial No. PCT/US2019/068287 dated Jul. 15, 2021, 6 pages.
Non Final Office Action received for U.S. Appl. No. 17/237,224 dated Sep. 30, 2021, 22 pages.
Non Final Office Action received for U.S. Appl. No. 16/724,548 dated Jan. 26, 2022, 36 pages.
Notice of Allowance received for U.S. Appl. No. 17/237,224 dated Jan. 11, 2023, 27 pages.
Notice of Allowance received for U.S. Appl. No. 17/728,122 dated Nov. 29, 2022, 36 pages.
Non Final Office Action received for U.S. Appl. No. 18/055,104 dated Mar. 9, 2023, 43 pages.
Notice of Allowance received for U.S. Appl. No. 17/237,224 dated Apr. 24, 2023, 6 pages.

* cited by examiner

METHOD AND APPARATUS FOR AUTOMOTIVE VARIABLE IMPEDANCE TOUCH SENSOR ARRAY

CROSS-REFERENCE TO RELATED APPLICATIONS

This patent application is a continuation of U.S. patent application Ser. No. 17/226,522 (now U.S. Pat. No. 11,353, 979), filed Apr. 9, 2021, entitled "METHOD AND APPARATUS FOR AUTOMOTIVE VARIABLE IMPEDANCE TOUCH SENSOR ARRAY," which is a continuation of U.S. patent application Ser. No. 16/414,419 (now U.S. Pat. No. 11,003,274), filed May 16, 2019, entitled "METHOD AND APPARATUS FOR AUTOMOTIVE VARIABLE IMPEDANCE TOUCH SENSOR ARRAY," which claims priority to U.S. Provisional Patent Application No. 62/730,757, entitled "METHOD AND APPARATUS FOR AUTOMOTIVE VARIABLE IMPEDANCE TOUCH SENSOR ARRAY," filed on Sep. 13, 2018, the disclosures of which are hereby expressly incorporated herein by reference in their entireties.

INTRODUCTION

The present invention relates to automotive touch sensor detector systems and methods incorporating an interpolated variable impedance touch sensor array. The systems and methods disclosed herein utilize a touch sensor array configured to detect proximity/contact/pressure via a variable impedance array electrically coupling interlinked impedance columns coupled to an array column driver and interlinked impedance rows coupled to an array row sensor. The array column driver is configured to select the interlinked impedance columns based on a column switching register and electrically drive the interlinked impedance columns using a column driving source. The variable impedance array conveys current from the driven interlinked impedance columns to the interlinked impedance columns sensed by the array row sensor. The array row sensor selects the interlinked impedance rows within the touch sensor array and electrically senses the interlinked impedance rows state based on a row switching register. Interpolation of array row sensor sensed current/voltage allows accurate detection of touch sensor array proximity/contact/pressure and/or spatial location.

The gesture recognition systems and methods using variable impedance array sensors include sensors disclosed in the following applications, the disclosures of which are hereby incorporated by reference in their entirety: U.S. patent application Ser. No. 15/599,365 titled SYSTEM FOR DETECTING AND CONFIRMING A TOUCH INPUT filed on May 18, 2017; U.S. patent application Ser. No. 15/653, 856 titled TOUCH SENSOR DETECTOR SYSTEM AND METHOD filed on Jul. 19, 2017 and issued as U.S. Pat. No. 10,073,565 on Sep. 11, 2018; U.S. patent application Ser. No. 15/271,953 titled DIAMOND PATTERNED TOUCH SENSOR SYSTEM AND METHOD filed on Sep. 21, 2016; U.S. patent application Ser. No. 14/499,090 titled CAPACITIVE TOUCH SENSOR SYSTEM AND METHOD filed on Sep. 27, 2014 and issued as U.S. Pat. No. 9,459,746 on Oct. 4, 2016; U.S. patent application Ser. No. 14/499,001 titled RESISTIVE TOUCH SENSOR SYSTEM AND METHOD filed on Sep. 26, 2014 and issued as U.S. Pat. No. 9,465,477 on Oct. 11, 2016; U.S. patent application Ser. No. 15/224,003 titled SYSTEMS AND METHODS FOR MANIPULATING A VIRTUAL ENVIRONMENT filed on Jul. 29, 2016 and issued as U.S. Pat. No. 9,864,461 on Jan. 9, 2018; U.S. patent application Ser. No. 15/223,968 titled SYSTEMS AND METHODS FOR MANIPULATING A VIRTUAL ENVIRONMENT filed on Jul. 29, 2016 and issued as U.S. Pat. No. 9,864,460 on Jan. 9, 2018; U.S. patent application Ser. No. 15/470,669 titled SYSTEM AND METHOD FOR DETECTING AND CHARACTERIZING FORCE INPUTS ON A SURFACE filed on Mar. 27, 2017; and U.S. patent application Ser. No. 15/476,732 titled HUMAN-COMPUTER INTERFACE SYSTEM filed on Oct. 5, 2017.

BRIEF DESCRIPTION OF THE DRAWINGS

The aforementioned objects and advantages of the present invention, as well as additional objects and advantages thereof, will be more fully understood herein after as a result of a detailed description of a preferred embodiment when taken in conjunction with the following drawings in which.

DETAILED DESCRIPTION

Figure 1:
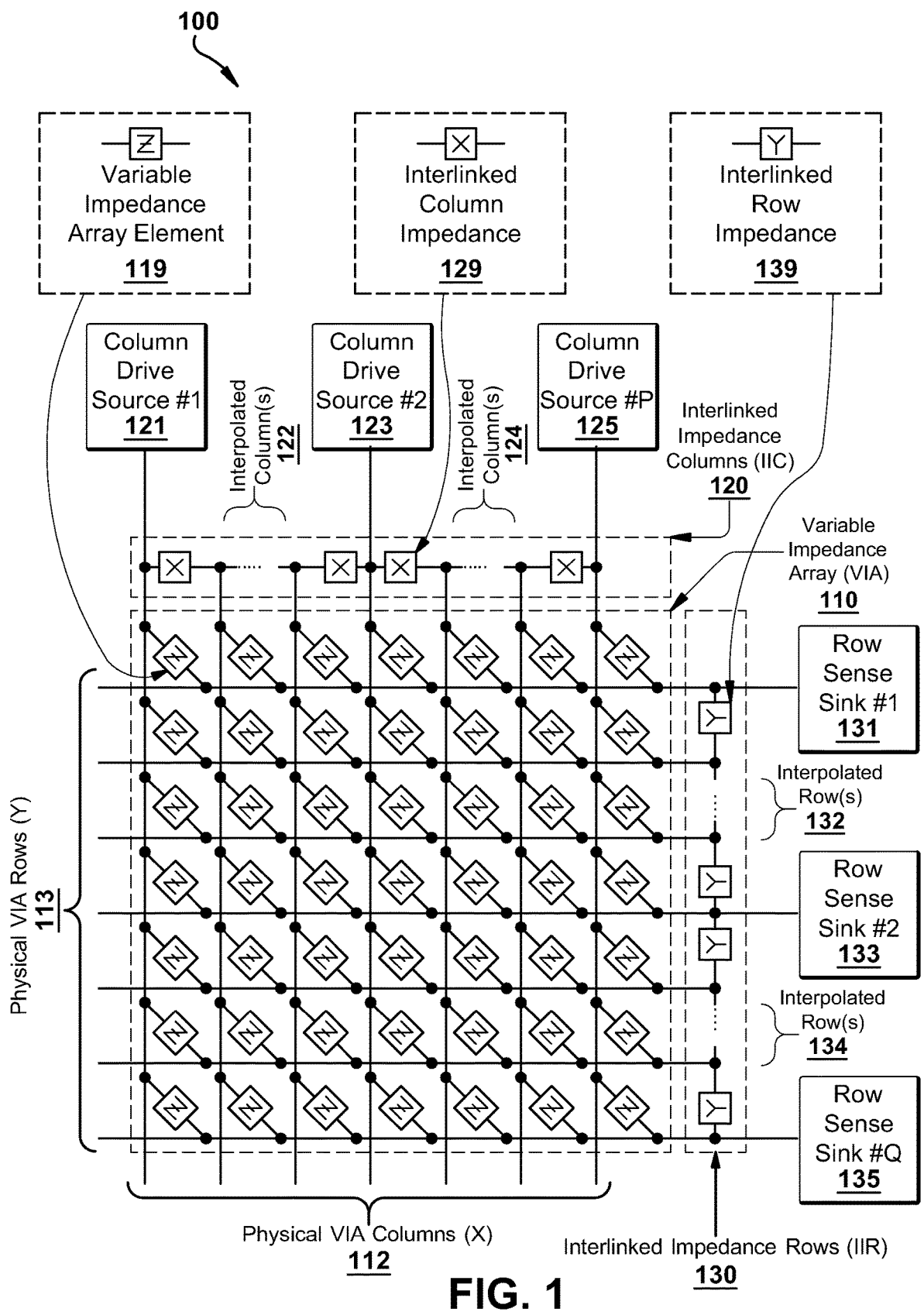
FIG. 1 illustrates an exemplary variable impedance touch sensor array with interlinked impedance columns and interlinked impedance rows.

The present invention relates to automotive touch sensor detector systems and methods incorporating an interpolated variable impedance touch sensor array. The systems and methods disclosed herein utilize a touch sensor array configured to detect proximity/contact/pressure via a variable impedance array electrically coupling interlinked impedance columns coupled to an array column driver and interlinked impedance rows coupled to an array row sensor. The array column driver is configured to select the interlinked impedance columns based on a column switching register and electrically drive the interlinked impedance columns using a column driving source. The variable impedance array conveys current from the driven interlinked impedance columns to the interlinked impedance columns sensed by the array row sensor. The array row sensor selects the interlinked impedance rows within the touch sensor array and electrically senses the interlinked impedance rows state based on a row switching register. Interpolation of array row sensor sensed current/voltage allows accurate detection of touch sensor array proximity/contact/pressure and/or spatial location.

In one embodiment, the present invention relates to automotive interface systems and methods. In one embodiment, an automotive interface system includes a steering wheel and an integrated interpolated variable impedance array that comprises a grid of sensing elements. The sensing elements are configured to power on simultaneously and to simultaneously generate multiple currents along multiple current paths in response to sensing a touch wherein the amount of current generated by a sensing element of the grid is directly proportional to the force applied by the touch. The automotive interface system also includes an analog-to-digital converter (ADC) and a processor communicatively coupled to the interpolated variable impedance array that are configured to receive the multiple currents along multiple current paths and determine a location, a duration, an area, and a force of the touch from the multiple currents along multiple current paths.

In some embodiments, the interpolated variable impedance array is disposed on the front side of the steering wheel. And in other embodiments, the interpolated variable impedance array is disposed on the back side of the steering wheel.

The interpolated variable impedance array may also comprise swipeable and/or pressable controls.

In other embodiments, the interpolated variable impedance array and the processor are configured to control one or more of the automobile's headlights, wipers, or blinkers. Additionally, the interpolated variable impedance array and the processor may be configured to determine an amount of pressure applied to the variable impedance touch sensor array. And the interpolated variable impedance array and the processor may be configured to control an audio source relative to the amount of pressure applied to the variable impedance touch sensor array.

In additional embodiments, the interpolated variable impedance array and the processor are configured to detect a driver's grip force of the steering wheel. And the interpolated variable impedance array and the processor may be configured to apply a control signal based on the driver's grip force of the steering wheel. Similarly, the interpolated variable impedance array and the processor may be configured to apply a control signal based on a pattern of the driver's grip force of the steering wheel.

In certain embodiments, the interpolated variable impedance array and the processor are configured to determine that the driver's grip force of the steering wheel is inadvertent or spurious. And the interpolated variable impedance array and the processor may be configured to determine when the driver is not gripping the steering wheel above a threshold level. In systems implemented in autonomous or semiautonomous vehicles, the processor may further be configured to send a signal to cause an autonomous or semiautonomous vehicle to return control to a driver. Moreover, the interpolated variable impedance array and the processor may be configured to determine when a driver has only one hand on the steering wheel.

In one embodiment, an automotive interface system includes a seat belt and an integrated interpolated variable impedance array that comprises a grid of sensing elements. The sensing elements are configured to power on simultaneously and to simultaneously generate multiple currents along multiple current paths in response to sensing a touch wherein the amount of current generated by a sensing element of the grid is directly proportional to the force applied by the touch. The automotive interface system also includes an ADC and a processor communicatively coupled to the interpolated variable impedance array that are configured to receive the multiple currents along multiple current paths and determine a location, a duration, an area, and a force of the touch from the multiple currents along multiple current paths.

In a related embodiment, the interpolated variable impedance array is incorporated in a fabric portion of the seat belt. In another embodiment, the interpolated variable impedance array and the processor are configured to determine a fit of the seat belt on a passenger. The interpolated variable impedance array and the processor may also be configured to determine instantaneous force signatures and patterns over time to determine that the fit of the seat belt. And the interpolated variable impedance array and the processor may be configured to send a control signal to realign a seat based on the instantaneous force signatures and patterns over time.

In another embodiment, an automotive interface system includes an accelerator pedal and an integrated interpolated variable impedance array that comprises a grid of sensing elements. The sensing elements are configured to power on simultaneously and to simultaneously generate multiple currents along multiple current paths in response to sensing a touch wherein the amount of current generated by a sensing element of the grid is directly proportional to the force applied by the touch. The automotive interface system also includes an ADC and a processor communicatively coupled to the interpolated variable impedance array that are configured to receive the multiple currents along multiple current paths and determine a location, a duration, an area, and a force of the touch from the multiple currents along multiple current paths.

Figure 2:
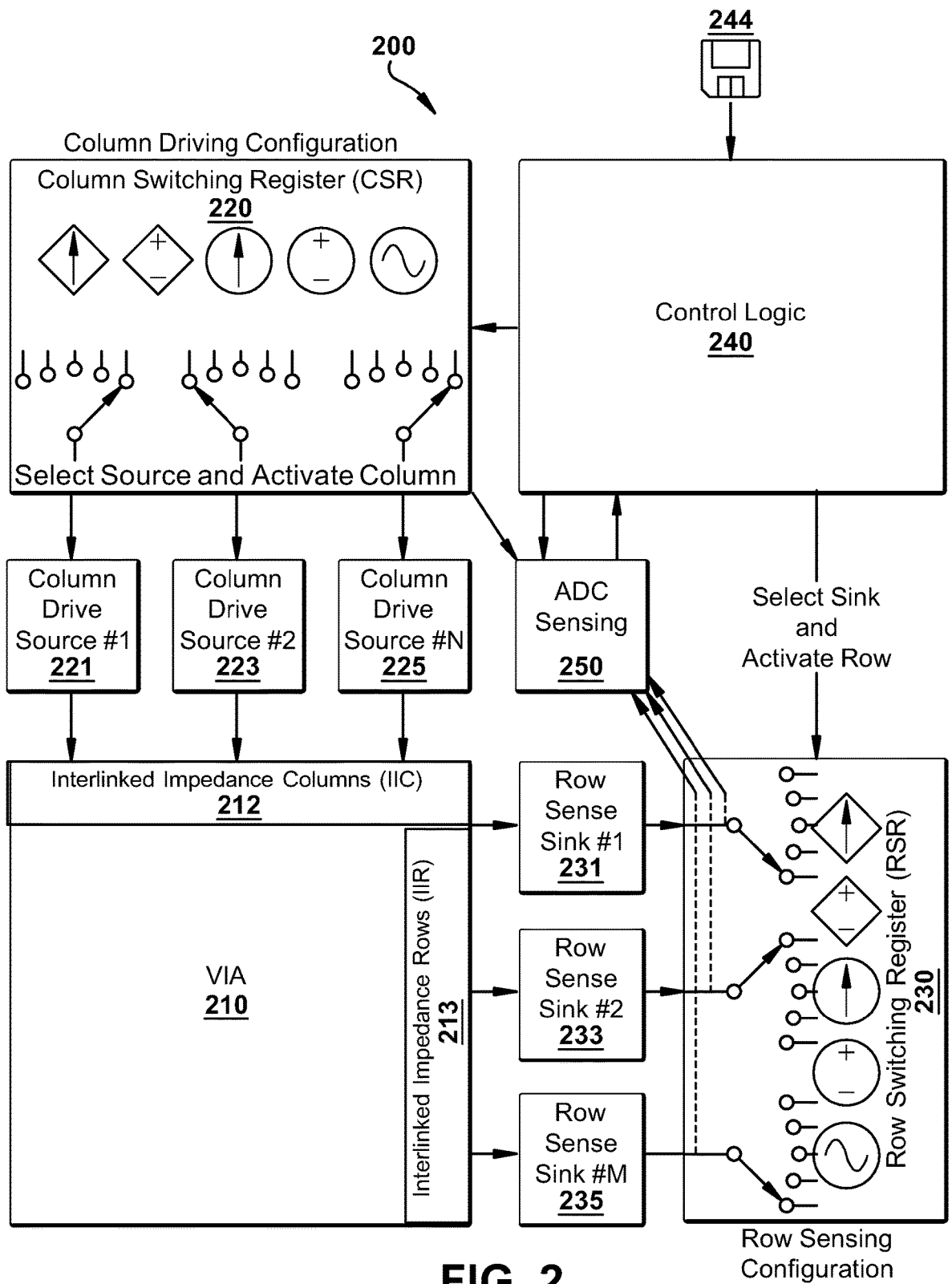
FIG. 2 illustrates an exemplary column switching register, row switching register, interlinked impedance column, and interlinked impedance row of an exemplary variable impedance touch sensor array.
Figure 3:
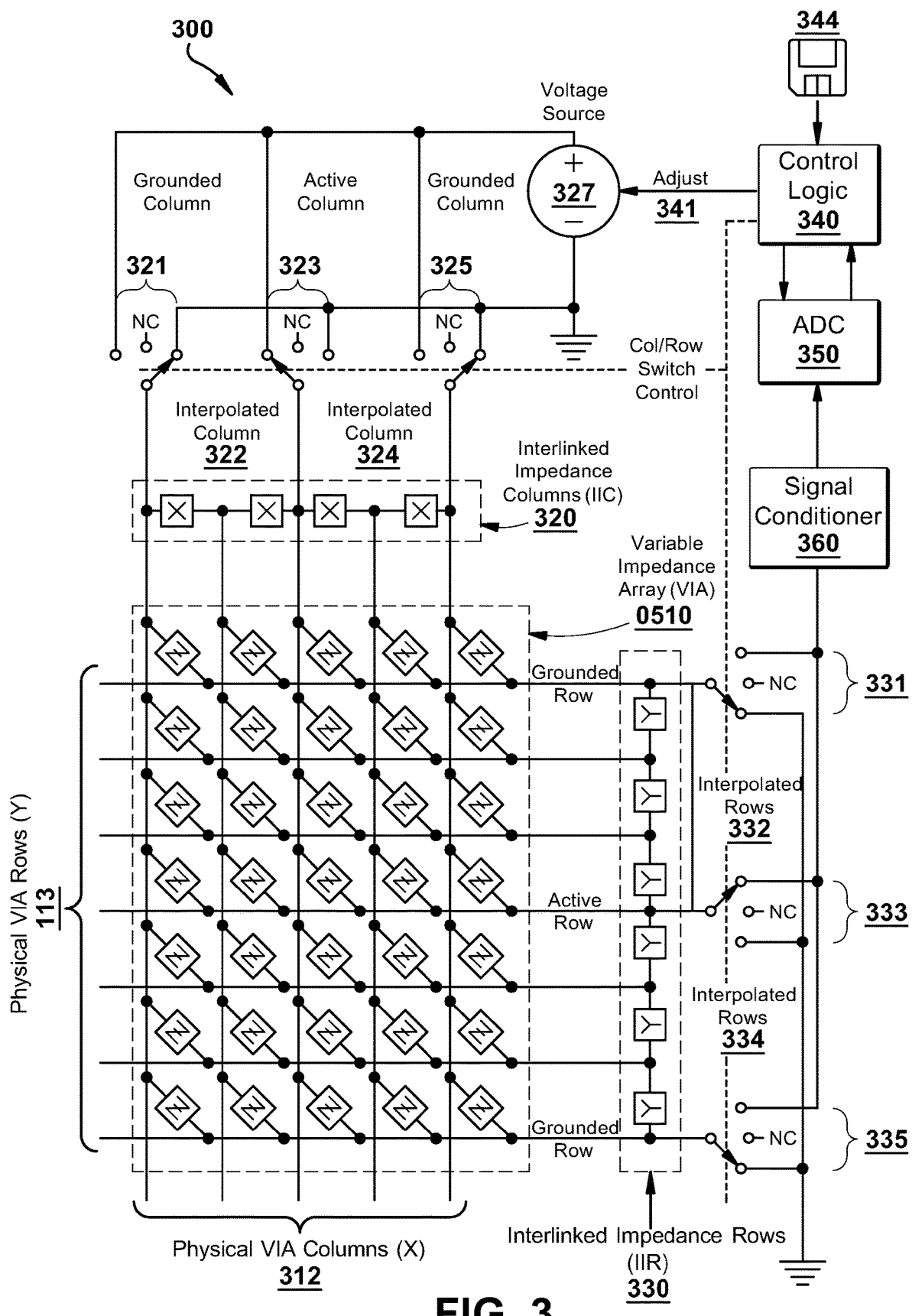
FIG. 3 illustrates an exemplary variable impedance touch sensor array.

FIGS. 1-3 illustrate an exemplary variable impedance touch sensor array 100, 200, 300 including interlinked impedance columns and interlinked impedance rows as well as an exemplary column switching register, row switching register, interlinked impedance column, and interlinked impedance row. FIG. 1 illustrates an exemplary variable impedance array 110, interlinked impedance columns 120, and interlinked impedance rows 130. Here the variable impedance array 110 includes columns 112 and rows 113 of an array in which individual variable impedance array elements 119 may interconnect within the row/column cross points of the array. These individual variable impedance array elements 119 may comprise active and/or passive components based on the application context, and include any combination of resistive, capacitive, and inductive components. Thus, the variable impedance array 110 array impedance elements (0319) are depicted generically in this diagram as generalized impedance values Z.

The physical variable impedance array columns 112 and variable impedance array rows 113 are connected via interlinked impedance columns 120 and interlinked impedance rows 130, respectively. The interlinked impedance columns 120 and interlinked impedance rows 130 are configured to reduce the number of columns and rows that are connected to the column drive sources 121, 123, 125 and the row sense sinks 131, 133, 135. As such, the combination of the interlinked impedance columns 120 and interlinked impedance rows 130 will reduce the external components necessary to interface to the variable impedance array columns 112 and variable impedance array rows 113. Within the context of the present invention, the number of interlinked impedance columns 120 interconnects will be configured to allow the reduction of the number of column drive sources 121, 123, 125 to less than the number of physical variable impedance array columns 112 (thus the number of external interlinked impedance columns is typically less than the number of internal interlinked impedance columns columns), and the interlinked impedance rows 130 interconnects will be configured to allow the reduction of the number of row sense sinks 131, 133, 135 to less than the number of physical variable impedance array rows 113 (thus the number of external interlinked impedance rows is typically less than the number of interlinked impedance rows rows). This reduction is achieved by having one or more interlinked impedance columns 120 elements 129 in series between each variable impedance array physical column 112 and one or more interlinked impedance rows 130 elements 139 between each variable impedance array physical row 113. Thus, the XXY variable impedance array sensor 110 is translated to an electrical interface only requiring P column drivers and Q row sensors. The present invention constrains P≤X and Q≤Y with many preferred embodiments satisfying the relations X/P≥2 or Y/Q≥2.

Note that within the context of these preferred embodiments, there may be circumstances where the interlinked impedance columns may incorporate a plurality of interlinked impedances with the interlinked impedance rows incorporating a singular interlinked impedance element, and circumstances where the interlinked impedance columns may incorporate a singular interlinked impedance element with the interlinked impedance rows incorporating a plurality of interlinked impedance elements.

The interlinked impedance columns 120 impedance elements 129 are configured to connect individual variable impedance array columns 112. These interlinked impedance columns 120 impedance elements 129 may comprise active and/or passive components based on the application context and include any combination of resistive, capacitive, and inductive components. Thus, the interlinked impedance columns 120 impedance elements 129 are depicted generically in this diagram as generalized impedance values X. As depicted in the diagram, the individual variable impedance array columns may either be directly driven using individual column drive sources 121, 123, 125 or interpolated 122, 124 between these directly driven columns.

The interlinked impedance rows 130 impedance elements 139 are configured to connect individual variable impedance array rows 113. These interlinked impedance rows 130 impedance elements 139 may comprise active and/or passive components based on the application context and include any combination of resistive, capacitive, and inductive components. Thus, the interlinked impedance rows 130 impedance elements 139 are depicted generically in this diagram as generalized impedance values Y. As depicted in the diagram, the individual variable impedance array rows may either be directly sensed using individual row sense sinks 131, 133, 135 or interpolated 132, 134 between these directly sensed rows.

The column drive sources 121, 123, 125 are generically illustrated as being independent in this diagram but may be combined in some configurations utilizing a series of switches controlled by a column switching register that defines the type of column drive source to be electrically coupled to each column that is externally accessible to the variable impedance array sensors 110. Variations of AC/DC excitation, voltage sources, open circuits, current sources, and other electrical source driver combinations may be utilized as switched configurations for the column drive sources 121, 123, 125. The column switching register may be configured to both select the type of electrical source to be applied to the variable impedance array sensors 110 but also its relative amplitude/magnitude.

The row sense sinks 131, 133, 135 are generically illustrated as being independent in this diagram but may be combined in some configurations utilizing a series of switches controlled by a row switching register that defines the type of row sense sinks to be electrically coupled to each row that is externally accessible to the variable impedance array sensors 110. Variations of AC/DC excitation, voltage sources, open circuits, current sources, and other electrical sense sink combinations may be utilized as switched configurations for the row sense sinks 131, 133, 135. The row switching register may be configured to both select the type of electrical sink to be applied to the variable impedance array sensors 110, but also its relative amplitude/magnitude.

Further detail of the column switching register and row switching register column/row source/sink operation is depicted in FIG. 2 (200) wherein the variable impedance array 210 is interfaced via the use of the interlinked impedance columns 212 and interlinked impedance rows 213 impedance networks to column drive sources 221, 223, 225 and row sense sinks 231, 233, 235, respectively. The column switching registers 220 may comprise a set of latches or other memory elements to configure switches controlling the type of source drive associated with each column drive source 221, 223, 225, the amplitude/magnitude of the drive source, and whether the drive source is activated. Similarly, the row switching registers 230 may comprise a set of latches or other memory elements to configure switches controlling the type of sense sink associated with each row sense sink 231, 233, 235, the amplitude/magnitude of the sink, and whether the sink is activated.

As mentioned previously, the interlinked impedance columns 212 and interlinked impedance rows 213 impedance networks may comprise a wide variety of impedances that may be static or actively engaged by the configuration of the column switching register 220 and row switching register 230, respectively. Thus, the column switching register 220 and row switching register 230 may be configured in some preferred embodiments to not only stimulate/sense the variable impedance array 210 behavior, but also internally configure the interlinked nature of the variable impedance array 210 by reconfiguring the internal column cross-links and the internal row cross-links. All this behavior can be determined dynamically by control logic 240 that may include a microcontroller or other computing device executing machine instructions read from a computer-readable medium 244. Within this context, the behavior of the analog-to-digital (ADC) converter 250 may be controlled in part by the configuration of the column switching register 220 and/or row switching register 230, as well as the control logic 240. For example, based on the configuration of the column switching register 220 and row switching register 230, the ADC 250 may be configured for specific modes of operation that are compatible with the type of sensing associated with the column switching register 220/row switching register 230 setup.

FIG. 3 illustrates 300 an exemplary variable impedance array sensor 310 in which the interlinked impedance columns 320 form a reduced electrical interface to the physical variable impedance array sensor columns 3123 that comprise the variable impedance array sensor array 310. Similarly, the interlinked impedance rows 330 form a reduced electrical interface to the physical variable impedance array sensor rows 313 that comprise the variable impedance array sensor array 310. Note in this example that the number of physical variable impedance array columns 312 need not be the same as the number of physical variable impedance array rows 313. Furthermore, the number of column interpolation impedance components (X) serially connecting each column of the variable impedance array 310 need not be equal to the number of row interpolation impedance components (Y) serially connecting each row of the variable impedance array 310. In other words, the number of interpolated columns 322, 324 need not be equal to the number of interpolated rows 332, 334.

The control logic 340 provides information to control the state of the column switches 321, 323, 325 and row switches 331, 333, 335. The column switches 321, 323, 325 define whether the individual variable impedance array columns are grounded or driven to a voltage potential from a voltage source 327 that may in some embodiments be adjustable by the control logic 340 to allow on-the-fly adjustment 341 which can be used to compensate for potential non-linearities in the driving electronics. Similarly, the row switches 331, 333, 335 define whether an individual variable impedance array row is grounded or electrically coupled to the signal conditioner 360 and associated ADC 350.

In the configuration depicted in FIG. 3, the variable impedance array sensors 310 comprise uniformly two interpolating impedances between each column (X) and three interpolating impedances between each row (Y). This illustrates the fact that the number of interpolating columns need not equal the number of interpolating rows in a given variable impedance array. Furthermore, it should be noted that the number of interpolating columns need not be uniform across the variable impedance array, nor does the number of interpolating rows need be uniform across the variable impedance array. Each of these parameters may vary in number across the variable impedance array.

Note also that the variable impedance array sensors 310 need not have uniformity within the row or column interpolating impedances and that these impedances in some circumstances may be defined dynamically in number and/or value using MOSFETs or other transconductors. In this exemplary variable impedance array sensor segment, it can be seen that one column 323 of the array is actively driven while the remaining two columns 321, 325 are held at ground potential. The rows are configured such that one row 333 is being sensed by the signal conditioner 360/ADC combination 350 while the remaining rows 331, 335 are held at ground potential.

Figure 4:
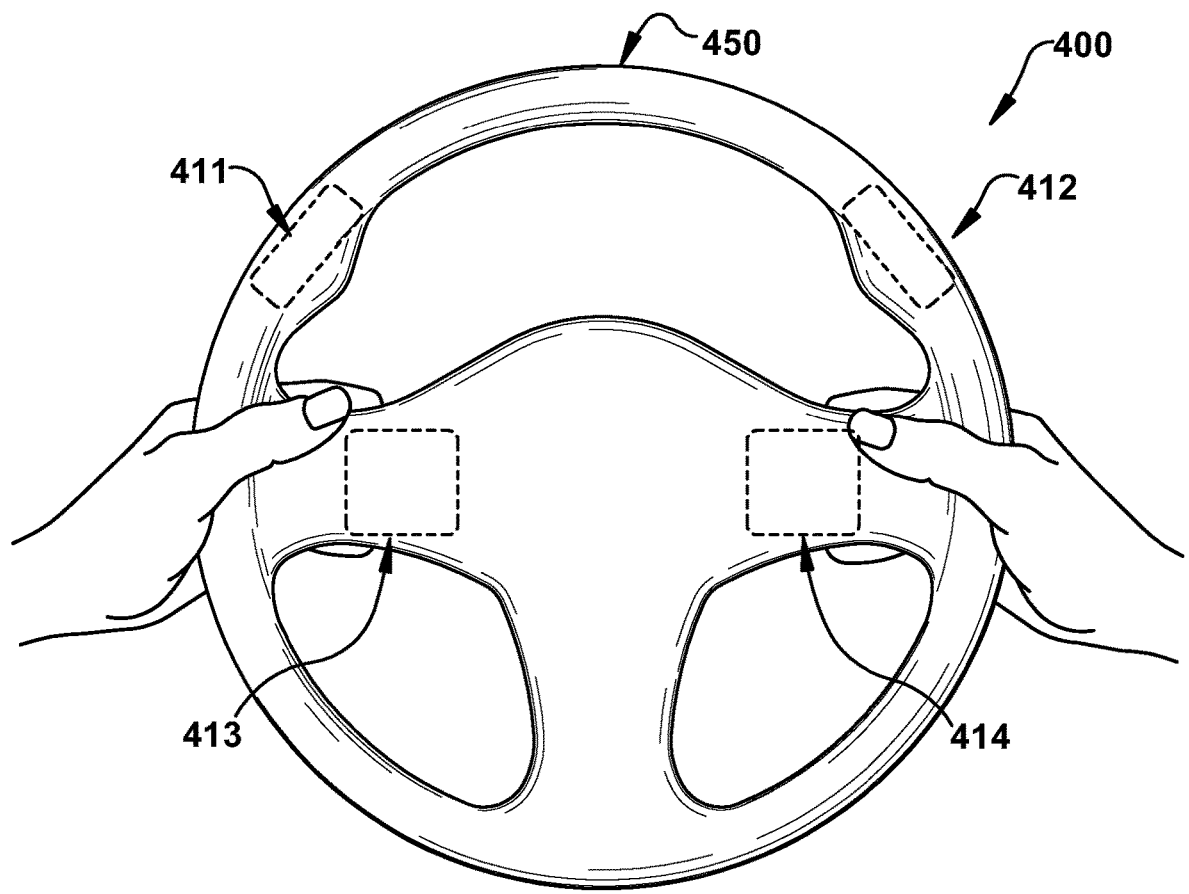
FIG. 4 illustrates an automotive touch sensor detector system using an exemplary interpolated variable impedance sensor array.

FIG. 4 illustrates an exemplary embodiment 400 of an automotive touch sensor detector incorporating an interpolated variable impedance touch sensor array. In this embodiment, interpolated variable impedance touch sensor arrays 411, 412, 413, 414 are incorporated into a steering wheel 450. The interpolated variable impedance touch sensor arrays 411, 412, 413, 414 are communicatively coupled to a processor programmed to receive pressure information from the sensor array. As described above and in the incorporated references, the sensor array is designed to provide a continuous pressure gradient over a specified interval. To accomplish this, the sensor array preferably has a distance between adjacent sensor elements smaller than finger width. The interpolated variable impedance touch sensor arrays 411, 412, 413, 414 are illustrated as sections near the thumb and fingers of a driver during normal driving operations. The interpolated variable impedance touch sensor arrays 411, 412, 413, 414 may be located in or on the front side of the steering wheel 450 and/or the back side of the steering wheel 450.

Figure 5:
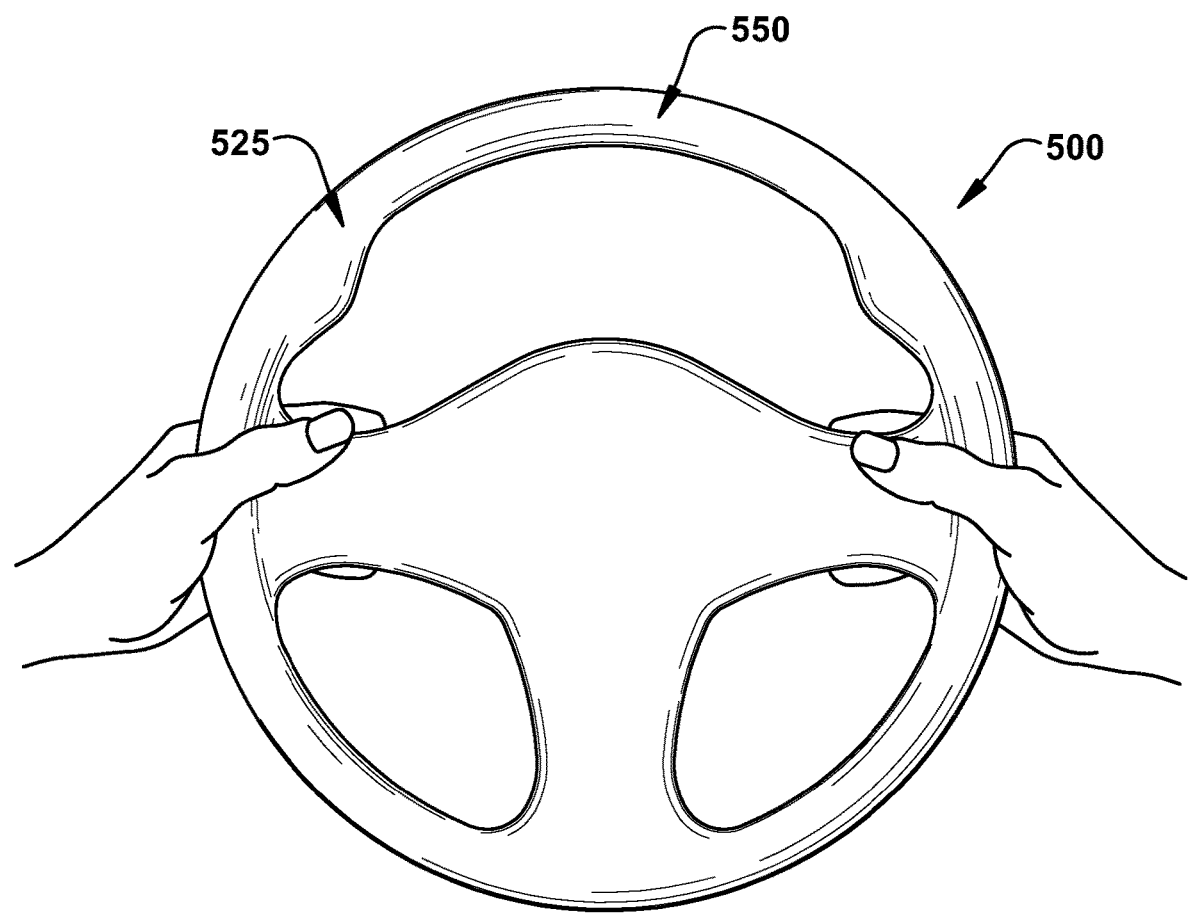
FIG. 5 illustrates an automotive touch sensor detector system using an exemplary interpolated variable impedance sensor array.

FIG. 5 illustrates an alternate embodiment 500 of an automotive touch sensor detector incorporating an interpolated variable impedance touch sensor array. In this embodiment, the variable impedance touch sensor array or arrays 525 may encompass part or all of the surface 525 of the steering wheel 550. The interpolated variable impedance touch sensor arrays 525 are communicatively coupled to a processor programmed to receive pressure information from the sensor array. As described above and in the incorporated references, the sensor array is designed to provide a continuous pressure gradient over a specified interval. To accomplish this, the sensor array preferably has a distance between adjacent sensor elements smaller than finger width. The interpolated variable impedance touch sensor arrays 525 may be located in or on the front side of the steering wheel 550 and/or the back side of the steering wheel 550.

In one example, the steering wheel 450, 550 includes variable impedance touch sensor arrays that comprise swipeable and/or pressable controls on the front and/or back surface of the steering wheel 450, 550. Such controls enable the driver to control automotive functions while maintaining hands on the wheel. In some embodiments, the variable impedance touch sensor arrays comprise controls to operate an automobile's headlights, wipers, and blinker. Additionally, using the continuous pressure response of the variable impedance touch sensor arrays, the controls can control the magnitude of the response relative to the amount of pressure applied to the variable impedance touch sensor arrays. For example, the sensors could control the speed of the swiping motion of windshield wipers relative to the amount of pressure applied to the array or section of an array assigned to controlling the wiper blades. Or the force controls using variable impedance touch sensor arrays can be used for audio controls including selecting an audio source, changing channels, or advancing or sending a reverse or rewind command based on the location of the touch on the steering wheel 450, 550. And the volume can be controlled relative to the amount of pressure of the touch on the variable impedance touch sensor arrays. In addition to control of automotive function and audio are specifically, the sensors may be used to control other automotive functions. For example, the sensor and system described may be used to launch an application or perform an action on a connected device (e.g. driver's phone), select a destination on a map, switch the function that an input surface controls, etc.

Figure 6:
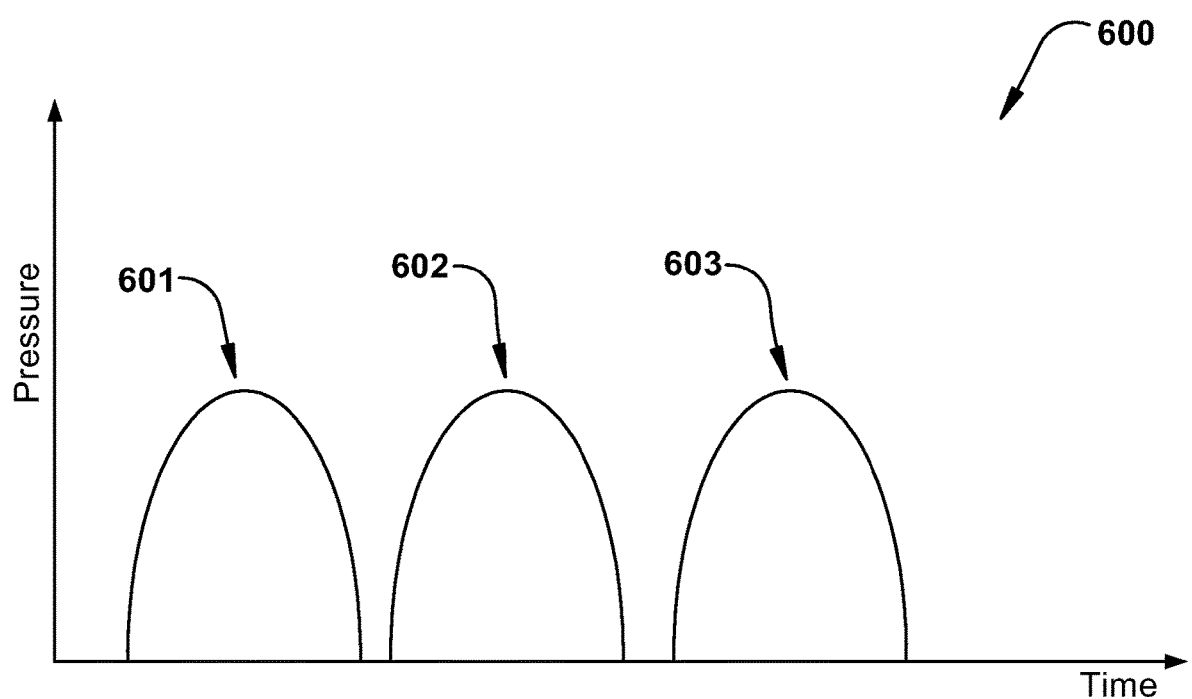
FIG. 6 illustrates an exemplary grip or squeeze pattern using an automotive touch sensor detector incorporating an interpolated variable impedance touch sensor array.

In another embodiment, variable impedance touch sensor arrays are embedded in the steering wheel 450, 550 such that the variable impedance touch sensor arrays can detect a driver's grip or squeeze of part of the steering wheel 450, 550. The coupled processor may be programmed to apply a control signal to the automobile based on the grip or squeeze, sequence of grips or squeezes, and/or pattern of grips and or squeezes. For example, a double squeeze (or similar or more complex pattern) could be used to power on an automate device or send a control signal to systems in the car (e.g., audio systems, cruise control, lighting, etc.). One advantage of requiring patterns or sequences of grips or squeezes is to differentiate between spurious pressure and desired actions and thereby reject spurious inputs. FIG. 6 illustrates an exemplary embodiment of such a system that uses a grip or squeeze pattern to reject spurious inputs. As shown in the graph 600 of FIG. 6, three sequential grips 601,

602, 603 are received at the steering wheel. This specific pattern (within a given threshold) can be recognized and used to send control signals to automotive systems.

In one example, a squeeze or grip is used to select an item in one of the automotive systems (e.g., audio, lighting, navigation, etc.). In one example, the squeeze or grip may be used for car navigation, so the driver does not have to interact with a navigation screen. Alternatively, such systems may be used to transfer control of autonomous vehicles back to a driver. For example, in an autonomous vehicle equipped with a steering wheel, the driver could squeeze or grip the wheel with a threshold force and/or pattern to take control of the vehicle. Similarly, the grip or squeeze strength and/or pattern could be used to control acceleration and/or braking of a vehicle.

In additional embodiments, the variable impedance touch sensor arrays incorporated in the steering wheel 450, 550 may be used to detect when the driver is not adequately gripping the steering wheel 450, 550. For example, if the driver becomes drowsy or is distracted, the system may use the continuous pressure information from the variable impedance touch sensor arrays to determine that the driver needs an alert or that other safety measures need to be implemented (e.g., slowing the vehicle down or initiating an alarm). Additionally, because the variable impedance touch sensor arrays can be used to determine continuous pressure patterns, the includes variable impedance touch sensor array data to generate a force profile that can be used to determine if the driver is driving with limited control of the steering wheel 450, 550 (e.g., driving with one hand or with a knee on the wheel). The system's ability to distinguish light exploratory touch from more forceful intentional touch allows for real-time non-visual feedback (e.g. auditory). For example, it allows controls to say their function when touched and execute when pressed. It also allows the driver to find the location of the controls by touch without accidental activation. Similarly, the system has the ability to provide continuous feedback from very light touch to very firm.

The variable impedance touch sensor arrays of the present invention may be incorporated in various surfaces (e.g., steering wheel, dash board, center console, gear shifter, arm rest, door interior and handle, sun visor, control levers) in an automobile to create control surfaces. Such control surfaces (particularly those convenient for the driver to reach like the arm rest and steering wheel) advantageously reduce a driver's reliance on visual cues like those from a touch screen or standard knobs and similar conventional interfaces thereby improving the driver's ability to maintain eye contact with the road. The variable impedance touch sensor arrays may be incorporated under the surface covering (e.g., leather, vinyl, plastic, fabric) of the surface. The arrays may have outlines stitched into the covering material or printed indicators or LED to make area glow to indicate the touch sensitive areas to the driver.

Figure 7:
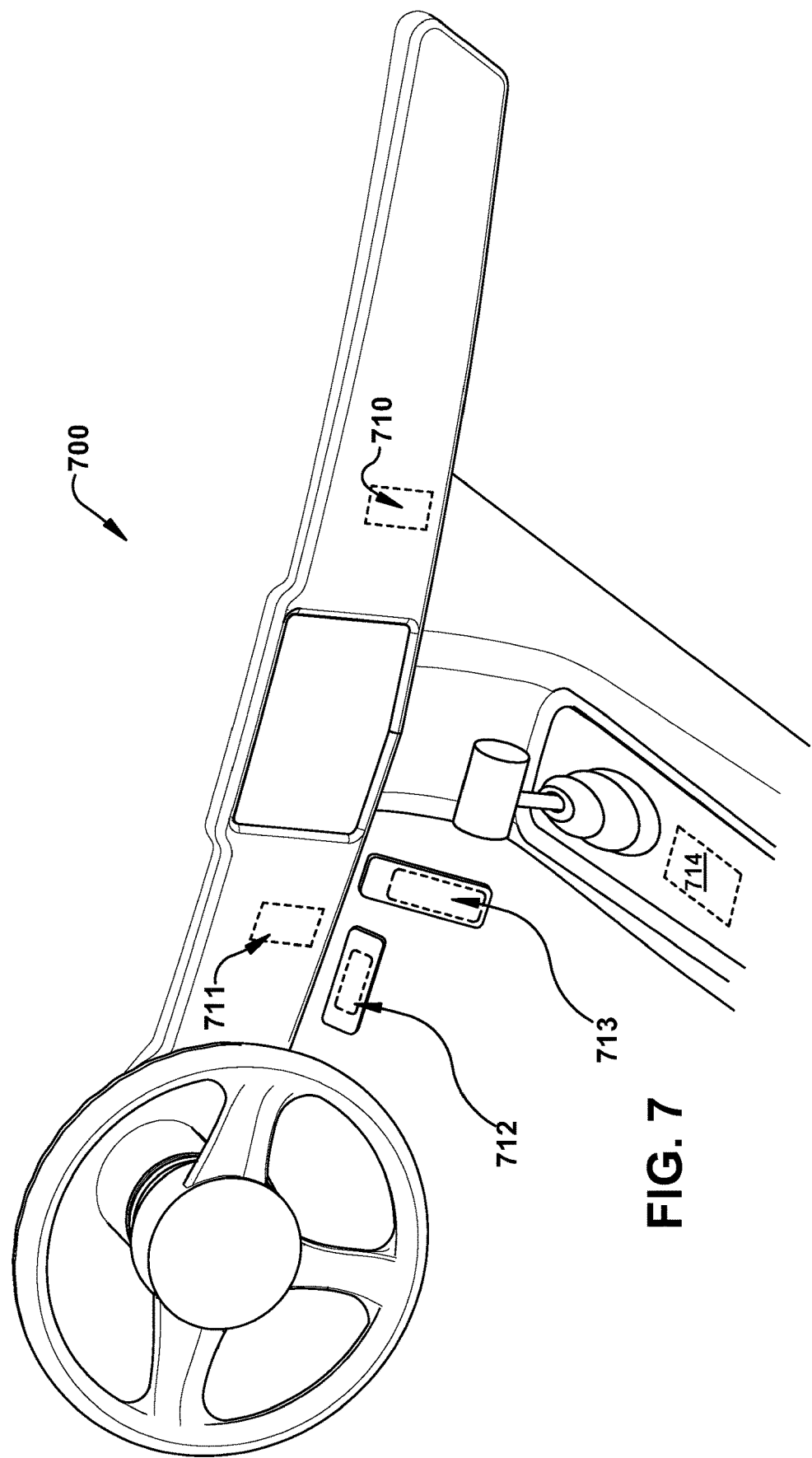
FIG. 7 illustrates an automotive touch sensor detector system using an exemplary interpolated variable impedance sensor array.

For example, FIG. 7 illustrates an interior 700 of an automobile incorporating variable impedance touch sensor arrays of the present invention may be incorporated in various surfaces of the interior. As illustrated in FIG. 7, the variable impedance touch sensor arrays of the present invention may be incorporated into the dash 710, 711. The variable impedance touch sensor arrays of the present invention may be incorporated in the dash near the passenger 710 and/or near the driver 711. The variable impedance touch sensor arrays of the present invention may be incorporated in the surface of the brake pedal 712 and/or the gas pedal 713. In addition, variable impedance touch sensor arrays of the present invention may be incorporated into the console 714 of the automobile.

The interpolated variable impedance touch sensor arrays 710, 711, 712, 713, 714 are communicatively coupled to a processor programmed to receive pressure information from the sensor array. As described above and in the incorporated references, the sensor array is designed to provide a continuous pressure gradient over a specified interval. To accomplish this, the sensor array preferably has a distance between adjacent sensor elements smaller than finger width. In one example, a touch (or pattern of touches) to the variable impedance touch sensor arrays 710, 711, 712, 713, 714 is used to select an item in one of the automotive systems (e.g., audio, lighting, navigation, etc.). In one example, touch may be used for car navigation, so the driver does not have to interact with a navigation screen. Alternatively, such systems may be used to transfer control of autonomous vehicles back to a driver.

In addition, the system may use the data from the interpolated variable impedance touch sensor arrays in the gas pedal 712 and/or brake pedal 713 for control of the acceleration and/or deceleration of the automobile. For example, the force applied to the gas pedal sensor 712 may be used to control acceleration, and the force applied to the brake pedal sensor 713 may be used to control deceleration. Additionally, the system may use patterns of touches or applications of force to the pedal sensors 712, 713 to control the automobile.

With the variable impedance touch sensor arrays disclosed herein, essential or common controls can be moved into the steering wheel (or other surfaces as described above) itself. The disclosed sensors allow incorporation of touch arrays on the outside of the steering wheel and other surfaces even when covered with leather, vinyl, or other textured material (e.g., to ensure that the driver can have a good grip on the wheel). With the disclosed variable impedance touch sensor array technology, the sensors may be incorporated into the outer area of the steering wheel (and other surfaces) itself. This way the driver does not need his or her hands away from the safe positions on the steering wheel to make commands.

In some embodiments, the control surfaces also include haptic feedback devices for providing feedback to the driver based on the driver's touch input. In some embodiments, the sensor arrays are used to determine patterns or gestures on the control surfaces that are used to control automotive systems including mirrors, cameras, audio, environmental controls, lighting, seat placement, seat adjustments, headlights, external lights, and turn signals.

Figure 8:
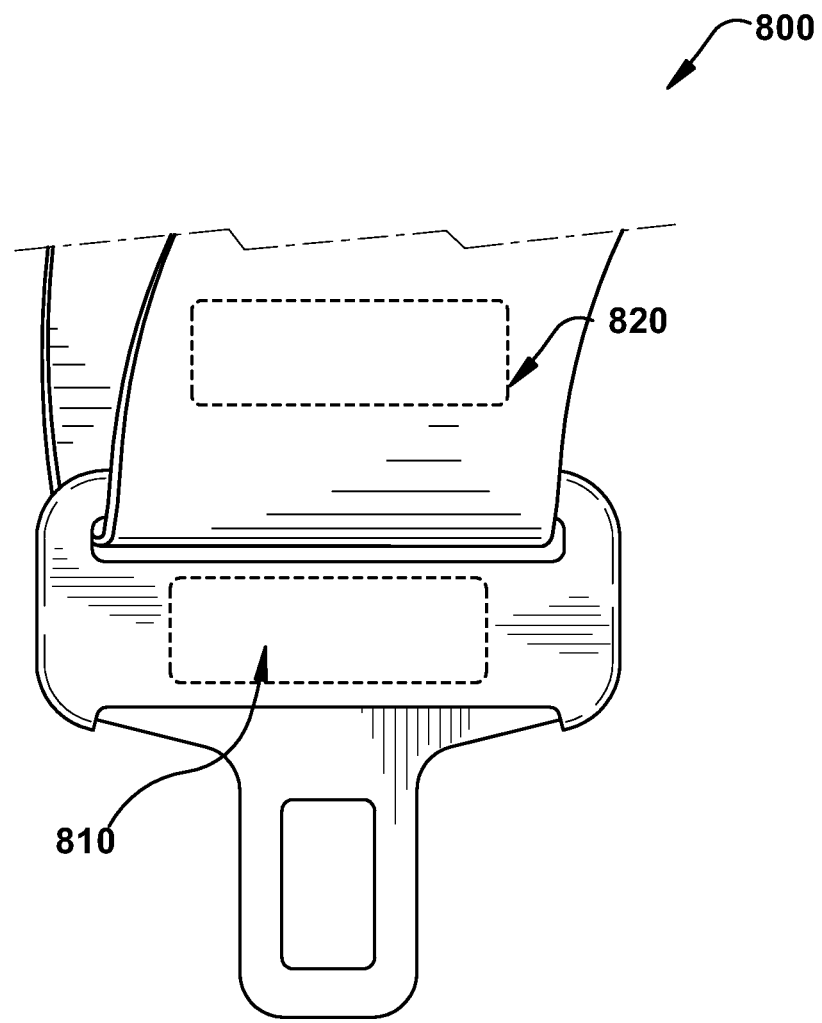
FIG. 8 illustrates an automotive touch sensor detector system using an exemplary interpolated variable impedance sensor array.

In other embodiments, as shown in FIG. 8 for example, the variable impedance touch sensor arrays 810, 810 of the present invention may be incorporated into seats and/or seatbelts 800. With the disclosed variable impedance touch sensor array technology, the sensors 810, 820 may be incorporated into material of the seatbelt (e.g., fabric, plastic of the buckle) and/or seat (e.g., fabric, vinyl, leather) of the seat. Seat belt sensors may be used to check for proper fit. This would be especially advantageous in child seats and/or for seats occupied by children, both situations in which proper seatbelt placement is difficult. The variable impedance touch sensor arrays incorporated in the seatbelt and/or seat can be used to determine instantaneous force signatures and patterns over time to determine that the fit of the belt and/or seat is proper. Additionally, the variable impedance touch sensor arrays could be used to redistribute and/or realign seats to accommodate occupants based on their instantaneous force signatures and patterns over time. In other embodiments, the variable impedance touch sensor arrays can be used to provide input to automotive systems (such as steering or the other systems described above) for example by placing pressure or shifting weight to one area of the seat.

Figure 9:
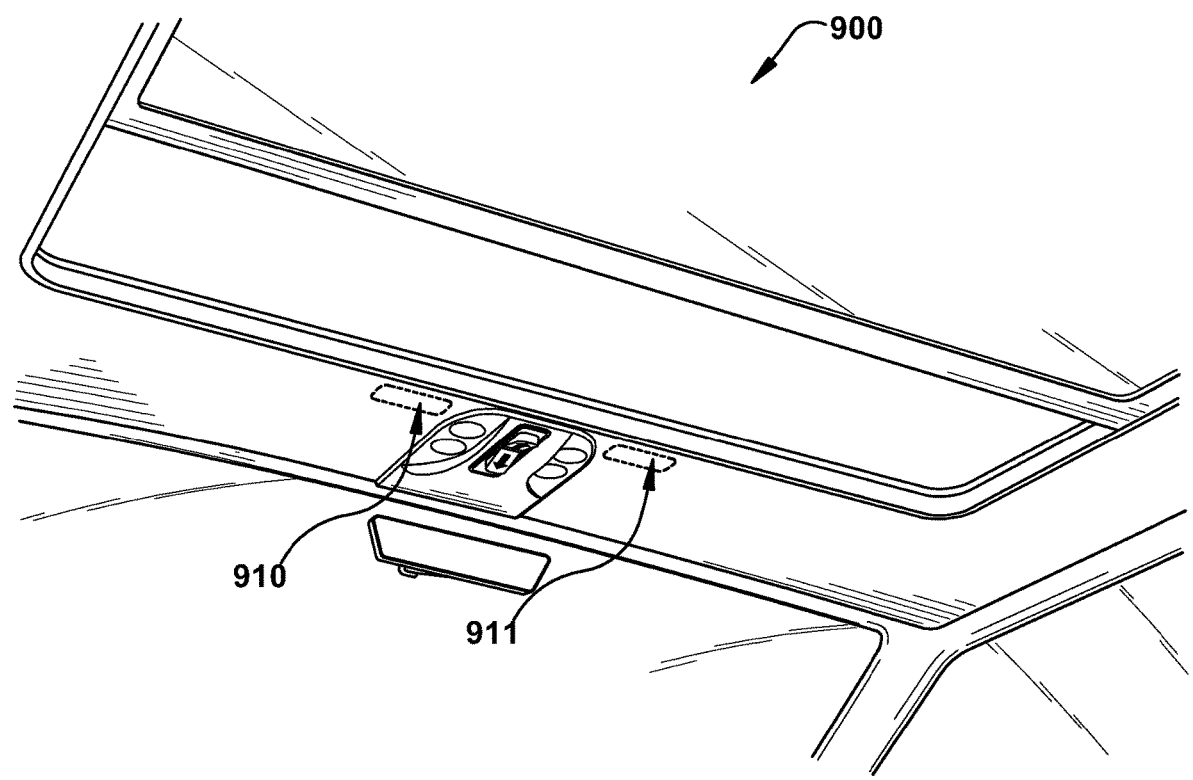
FIG. 9 illustrates an automotive touch sensor detector system using an exemplary interpolated variable impedance sensor array.

As illustrated in FIG. 9, the variable impedance touch sensor arrays 910, 911 may be incorporated in other surfaces of the automobile including the interior roof 900 of the automobile. The variable impedance touch sensor arrays 910, 911 may be incorporated in a small or large portion of a surface of the roof 900. The variable impedance touch sensor arrays 910, 911 may provide touch and/or pressure data that the system may use to control elements of the automobile such as windows or sun visors. Because of the continuous pressure response data provided from the variable impedance touch sensor arrays 910, 911, the data may control the state of the controlled device (e.g., on/off or open/closed) as well as the rate of the change between states.

Figure 10:
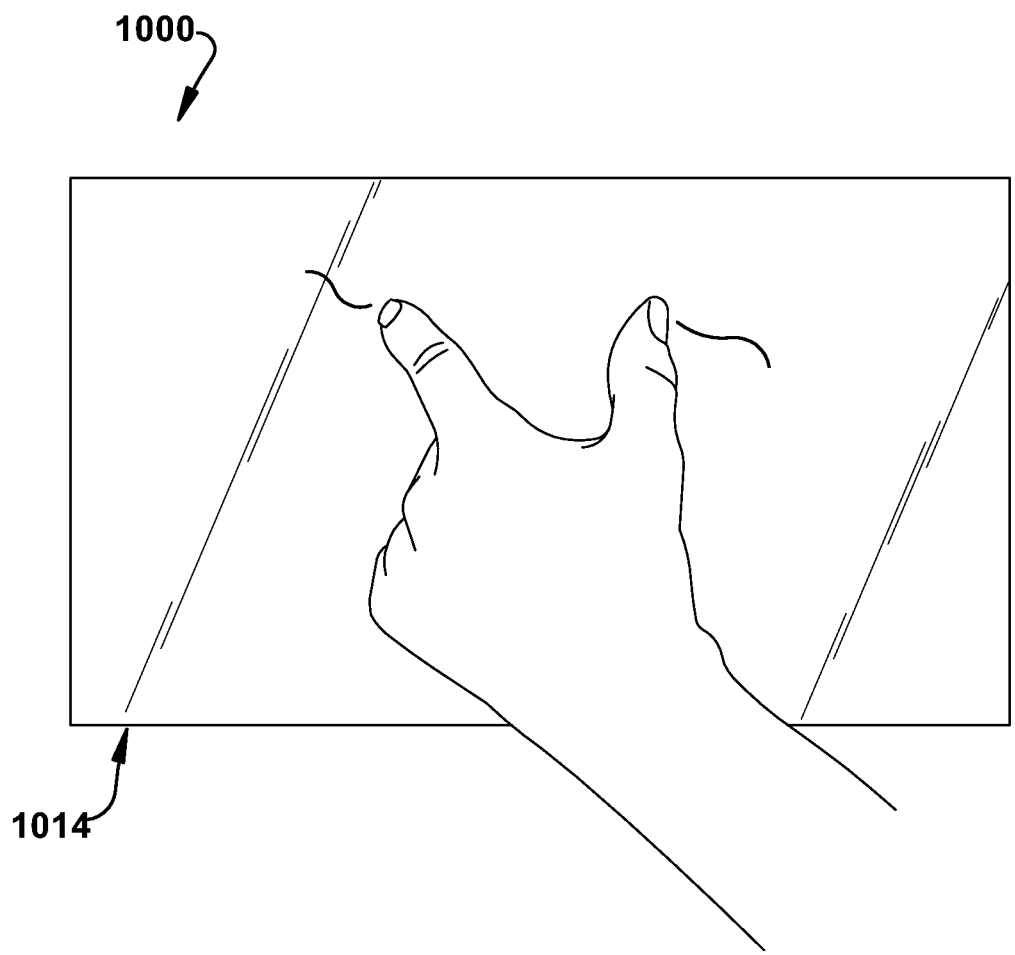
FIG. 10 illustrates an automotive touch sensor detector system using an exemplary interpolated variable impedance sensor array.

FIG. 10 illustrates a further embodiment in which the variable impedance touch sensor arrays of the present invention are incorporated in surfaces of an automobile as shown in FIGS. 7 and 9. As shown in FIG. 10, the touch surface 1014 defined by the variable impedance touch sensor arrays may cover a large surface 1014 such as that shown larger than the hand of a user. The variable impedance touch sensor arrays of the present invention may be incorporated into a large-scale surface in various interior surfaces including the dash near the passenger and/or near the driver as well as in surfaces such as the surface of the brake pedal and/or the gas pedal. Additionally, the large-scale surface with variable impedance touch sensor arrays of the present invention is advantageously incorporated into the console of the automobile.

The interpolated variable impedance touch sensor arrays in the surface 1014 are communicatively coupled to a processor programmed to receive pressure information from the sensor array. As described above and in the incorporated references, the sensor array is designed to provide a continuous pressure gradient over a specified interval. To accomplish this, the sensor array preferably has a distance between adjacent sensor elements smaller than finger width. In one example, a touch (or pattern of touches) to the variable impedance touch sensor arrays in the surface 1014 is used to select an item in one of the automotive systems (e.g., audio, lighting, navigation, etc.). In one example, touch may be used for car navigation, so the driver does not have to interact with a navigation screen. Alternatively, such systems may be used to transfer control of autonomous vehicles back to a driver.

With the variable impedance touch sensor arrays disclosed herein, essential or common controls can be moved into the steering wheel (or other surfaces as described above) itself. The disclosed sensors allow incorporation of touch arrays on the outside of the steering wheel and other surfaces even when covered with leather, vinyl, or other textured material (e.g., to ensure that the driver can have a good grip on the wheel). With the disclosed variable impedance touch sensor array technology, the sensors may be incorporated into the outer area of the steering wheel (and other surfaces) itself. This way the driver does not need his or her hands away from the safe positions on the steering wheel to make commands.

In some embodiments, the control surfaces also include haptic feedback devices for providing feedback to the driver based on the driver's touch input. In some embodiments, the sensor arrays are used to determine patterns or gestures on the control surfaces that are used to control automotive systems including mirrors, cameras, audio, environmental controls, lighting, seat placement, seat adjustments, headlights, external lights, and turn signals.

In addition to the systems disclosed above, the present invention relates to automotive touch sensor detector methods incorporating an interpolated variable impedance touch sensor array. The methods disclosed herein utilize a touch sensor array configured to detect proximity/contact/pressure via a variable impedance array electrically coupling interlinked impedance columns coupled to an array column driver and interlinked impedance rows coupled to an array row sensor. The array column driver is configured to select the interlinked impedance columns based on a column switching register and electrically drive the interlinked impedance columns using a column driving source. The variable impedance array conveys current from the driven interlinked impedance columns to the interlinked impedance columns sensed by the array row sensor. The array row sensor selects the interlinked impedance rows within the touch sensor array and electrically senses the interlinked impedance rows state based on a row switching register. Interpolation of array row sensor sensed current/voltage allows accurate detection of touch sensor array proximity/contact/pressure and/or spatial location.

Figure 11:
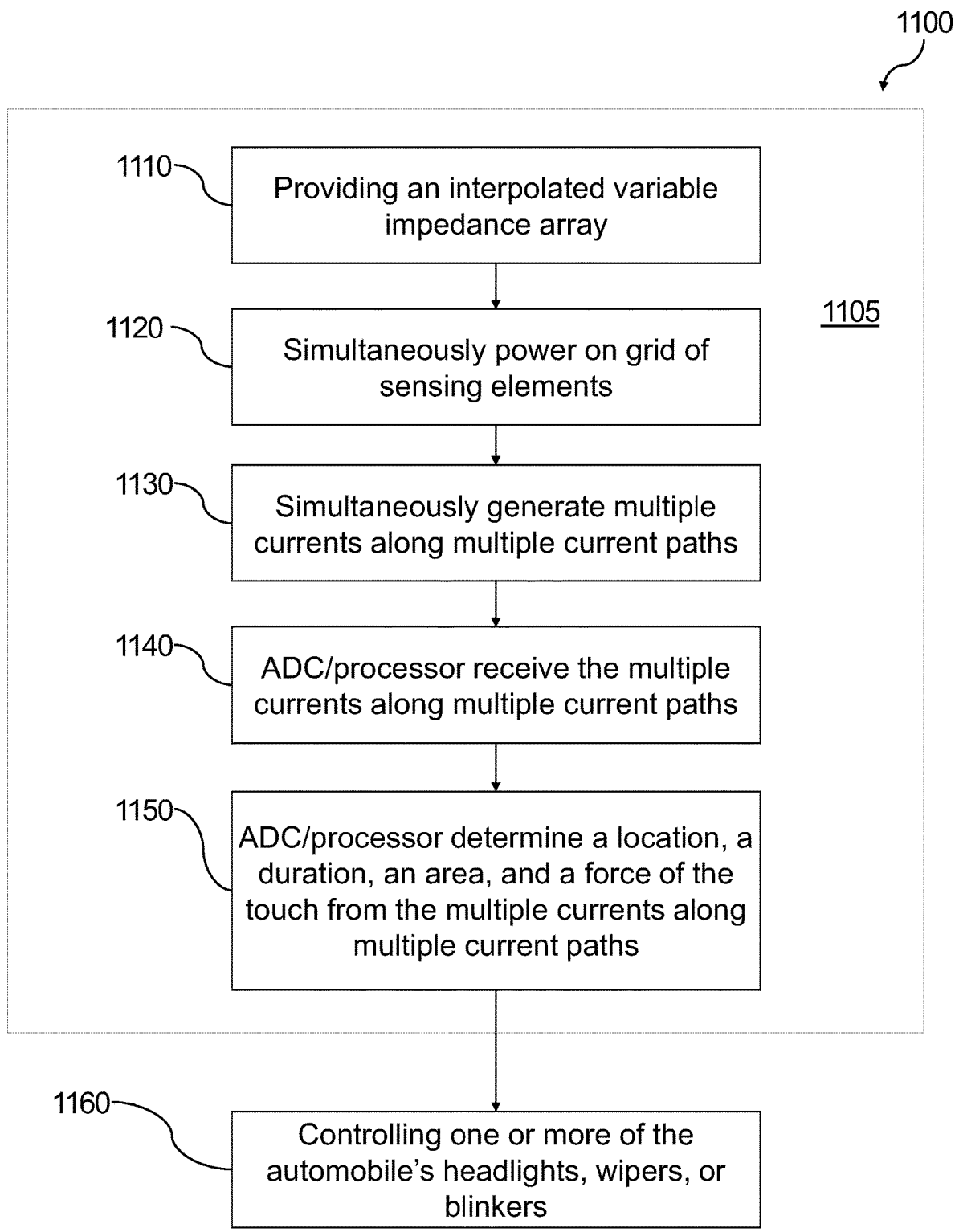
FIG. 11 illustrates a method of using an automotive touch sensor detector system using an exemplary interpolated variable impedance sensor array.

In one embodiment 1105 as illustrated in FIG. 11, the method 1100 includes providing an interpolated variable impedance array disposed on or about the steering wheel comprising a grid of sensing elements 1110. The grid of sensing elements powers on simultaneously 1120 and then simultaneously generates multiple currents along multiple current paths in response to sensing a touch 1130, wherein the amount of current generated by a sensing element of the grid is directly proportional to the force applied by the touch. Thereafter an ADC and a processor (communicatively coupled to the interpolated variable impedance array) receive the multiple currents along multiple current paths 1140 and determine a location, a duration, an area, and a force of the touch from the multiple currents along multiple current paths 1150. The interpolated variable impedance array may be disposed on the front side of the steering wheel or on the back side of the steering wheel for example. The interpolated variable impedance array may comprise swipeable and/or pressable controls.

Figure 12:
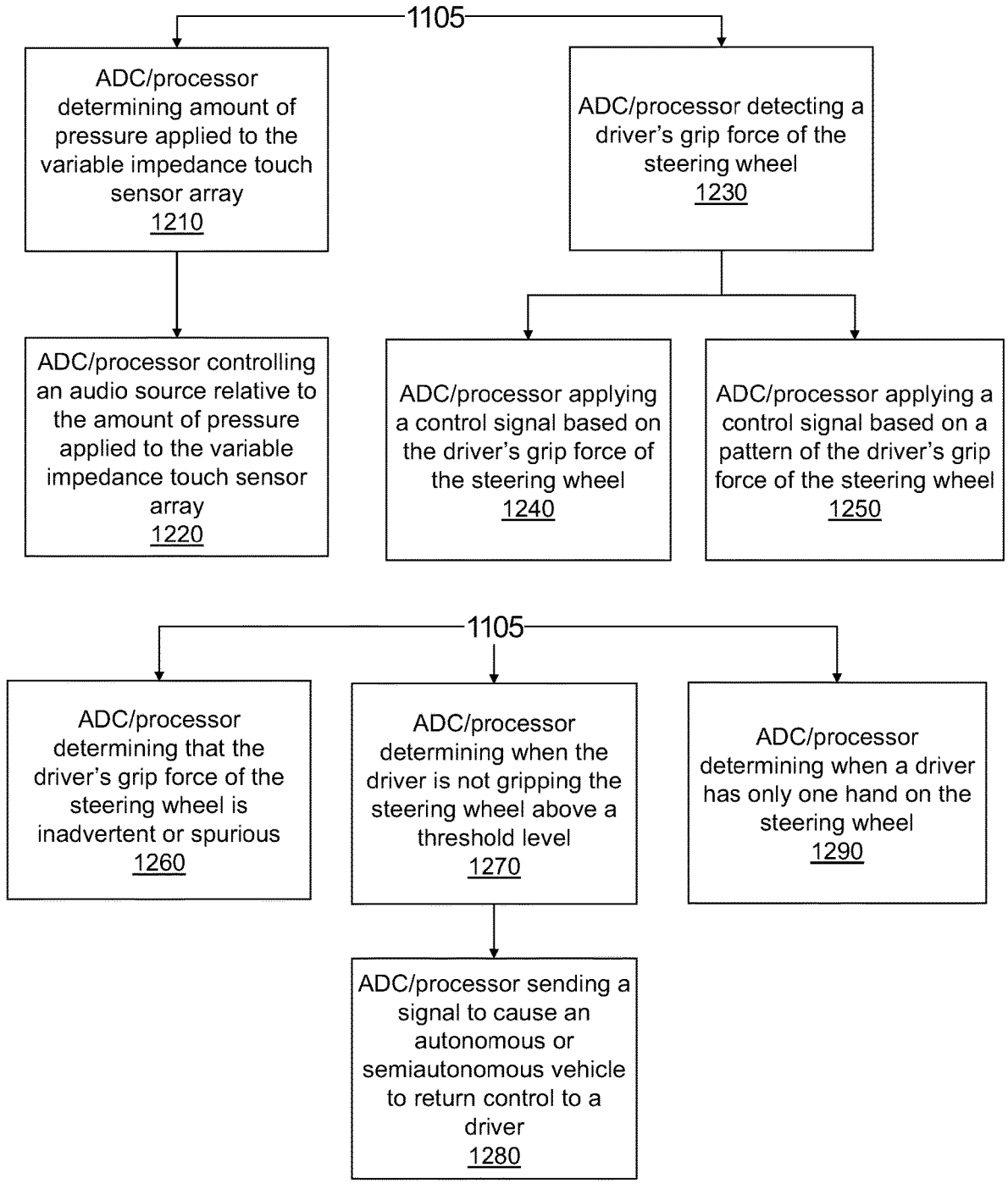
FIG. 12 illustrates a method of using an automotive touch sensor detector system using an exemplary interpolated variable impedance sensor array.

In a further embodiment, the method 1100 includes the variable impedance array and the processor controlling one or more of the automobile's headlights, wipers, or blinkers 1160. And as shown in FIG. 12, the method 1105 shown in FIG. 11 may further comprise the interpolated variable impedance array and the processor determining an amount of pressure applied to the variable impedance touch sensor array 1210 as well as the interpolated variable impedance array and the processor controlling an audio source relative to the amount of pressure applied to the variable impedance touch sensor array 1220. Also, as shown in FIG. 12, the method 1105 shown in FIG. 11 may further comprise the interpolated variable impedance array and the processor detecting a driver's grip force of the steering wheel 1230, applying a control signal based on the driver's grip force of the steering wheel 1240, and applying a control signal based on a pattern of the driver's grip force of the steering wheel 1250.

The method 1105 shown in FIG. 11 may further include the interpolated variable impedance array and the processor are determining that the driver's grip force of the steering wheel is inadvertent or spurious 1260. Moreover, the method 1105 shown in FIG. 11 may include the interpolated variable impedance array and the processor determining when the driver is not gripping the steering wheel above a threshold level 1270 and sending a signal to cause an autonomous or semiautonomous vehicle to return control to a driver 1280 or determining when a driver has only one hand on the steering wheel 1290.

Additional methods include providing an interpolated variable impedance array disposed on or about the seat belt comprising a grid of sensing elements. The grid of sensing elements powering on simultaneously and simultaneously generating multiple currents along multiple current paths in response to sensing a touch wherein the amount of current generated by a sensing element of the grid is directly proportional to the force applied by the touch. Thereafter, an ADC and a processor (communicatively coupled to the interpolated variable impedance array) receive the multiple currents along multiple current paths and determine a location, a duration, an area, and a force of the touch from the multiple currents along multiple current paths.

The ADC and a processor may further determine a fit of the seat belt on a passenger, determine instantaneous force signatures and patterns over time to determine that the fit of the seat belt, and/or send a control signal to realign a seat based on the instantaneous force signatures and patterns over time.

A further method includes providing an interpolated variable impedance array disposed on or about the acceleration pedal comprising a grid of sensing elements. The grid of sensing elements power on simultaneously and simultaneously generate multiple currents along multiple current paths in response to sensing a touch wherein the amount of current generated by a sensing element of the grid is directly proportional to the force applied by the touch. Then an ADC and a processor (communicatively coupled to the interpolated variable impedance array) receive the multiple currents along multiple current paths and determine a location, a duration, an area, and a force of the touch from the multiple currents along multiple current paths.

In the present specification, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in this specification and annexed drawings should generally be construed to mean "one or more" unless specified otherwise or clear from context to be directed to a singular form.

In addition, the terms "example" and "such as" are utilized herein to mean serving as an instance or illustration. Any embodiment or design described herein as an "example" or referred to in connection with a "such as" clause is not necessarily to be construed as preferred or advantageous over other embodiments or designs. Rather, use of the terms "example" or "such as" is intended to present concepts in a concrete fashion. The terms "first," "second," "third," and so forth, as used in the claims and description, unless otherwise clear by context, is for clarity only and does not necessarily indicate or imply any order in time.

What has been described above includes examples of one or more embodiments of the disclosure. It is, of course, not possible to describe every conceivable combination of components or methodologies for purposes of describing these examples, and it can be recognized that many further combinations and permutations of the present embodiments are possible. Accordingly, the embodiments disclosed and/or claimed herein are intended to embrace all such alterations, modifications and variations that fall within the spirit and scope of the detailed description and the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A vehicle interface system, comprising:
an interpolated variable impedance array disposed on or about at least one of a seat belt, an arm rest, and a sun visor, the interpolated variable impedance array comprising a grid of sensing elements configured to generate multiple currents along multiple current paths based on detection of a touch; and
an analog-to-digital converter and a processor communicatively coupled to the interpolated variable impedance array and configured to determine information related to the touch based on the multiple currents along the multiple current paths, wherein a magnitude of response associated with the touch is relative to an amount of pressure applied to the at least one of the seat belt, the arm rest, and the sun visor.

2. The vehicle interface system of claim 1, wherein the information comprises at least one of a location of the touch, a duration of the touch, an area of the touch, and a force of the touch.

3. The vehicle interface system of claim 1, wherein the interpolated variable impedance array facilitates a continuous pressure gradient based on a defined distance between adjacent sensing elements of the grid of sensing elements.

4. The vehicle interface system of claim 1, wherein respective sensing elements of the grid of sensing elements are configured to power on simultaneously.

5. The vehicle interface system of claim 1, wherein respective sensing elements of the grid of sensing elements are configured to simultaneously generate multiple currents along the multiple current paths in response to sensing the touch.

6. The vehicle interface system of claim 1, wherein an amount of current generated by a sensing element of the grid of sensing elements is directly proportional to a force applied by the touch.

7. The vehicle interface system of claim 1, wherein the interpolated variable impedance array and the processor are configured to facilitate control of a vehicle operation based on a pattern associated with the touch.

8. The vehicle interface system of claim 1, wherein the interpolated variable impedance array and the processor are configured to determine a fit of the seat belt on a passenger.

9. The vehicle interface system of claim 1, wherein the interpolated variable impedance array is incorporated in respective fabric portions of the seat belt, the arm rest, and the sun visor.

10. A vehicle interface system, comprising:
an interpolated variable impedance array disposed on or about at least one of a dash board, an interior roof, and a center console, the interpolated variable impedance array comprising a grid of sensing elements configured to generate multiple currents along multiple current paths based on detection of a touch; and
an analog-to-digital converter and a processor communicatively coupled to the interpolated variable impedance array and configured to determine information related to the touch based on the multiple currents along the multiple current paths, wherein a magnitude of response associated with the touch is relative to an amount of pressure applied to the at least one of the dash board, the interior roof, and the center console.

11. The vehicle interface system of claim 10, wherein the information comprises at least one of a location of the touch, a duration of the touch, an area of the touch, and a force of the touch.

12. The vehicle interface system of claim 10, wherein the interpolated variable impedance array facilitates a continuous pressure gradient based on a defined distance between adjacent sensing elements of the grid of sensing elements.

13. The vehicle interface system of claim 10, wherein respective sensing elements of the grid of sensing elements are configured to power on simultaneously.

14. The vehicle interface system of claim 10, wherein respective sensing elements of the grid of sensing elements are configured to simultaneously generate multiple currents along the multiple current paths in response to sensing the touch.

15. The vehicle interface system of claim 10, wherein an amount of current generated by a sensing element of the grid of sensing elements is directly proportional to a force applied by the touch.

16. The vehicle interface system of claim 10, wherein the interpolated variable impedance array and the processor are configured to facilitate control of a vehicle operation based on a pattern associated with the touch.

17. The vehicle interface system of claim 10, wherein the interpolated variable impedance array is incorporated in respective surface coverings of the dash board, the interior roof, and the center console.

18. The vehicle interface system of claim 17, wherein respective touch areas of arrays of the interpolated variable impedance array are indicated on the respective surface coverings.

19. The vehicle interface system of claim 10, wherein the interpolated variable impedance array is disposed on the dash board at a passenger side of a vehicle, a driver side of the vehicle, or at both the passenger side and the driver side.

20. The vehicle interface system of claim 10, wherein the interpolated variable impedance array and the processor are configured to facilitate control of respective functions of respective elements of a vehicle.

\* \* \* \* \*